(12) United States Patent
Hueting et al.

(10) Patent No.: US 6,534,823 B2
(45) Date of Patent: Mar. 18, 2003

(54) SEMICONDUCTOR DEVICE

(75) Inventors: Raymond J. E. Hueting, Helmond (NL); Erwin A. Hijzen, Blanden (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/860,358

(22) Filed: May 18, 2001

(65) Prior Publication Data

US 2001/0045599 A1 Nov. 29, 2001

(30) Foreign Application Priority Data

May 20, 2000 (GB) ............................................. 0012138

(51) Int. Cl.[7] ............................................. H01L 29/76
(52) U.S. Cl. ...................... 257/330; 257/332; 257/335; 257/342
(58) Field of Search ................................ 257/330, 332, 257/334, 335, 341, 342; 357/22, 23, 23.4, 55

(56) References Cited

U.S. PATENT DOCUMENTS

| 4,243,997 A | * | 1/1981 | Natori et al. ................ 257/330 |
| 4,835,584 A | | 5/1989 | Lancaster .................. 357/23.1 |
| 5,040,034 A | * | 8/1991 | Murakami et al. .......... 257/330 |
| 5,434,435 A | | 7/1995 | Baliga ........................ 257/141 |
| 5,723,891 A | * | 3/1998 | Malhi .......................... 257/341 |
| 6,072,215 A | * | 6/2000 | Kawaji et al. ............... 257/334 |
| 6,320,223 B1 | * | 11/2001 | Hueting et al. .............. 257/341 |

FOREIGN PATENT DOCUMENTS

WO  9943029 A1  8/1999

* cited by examiner

*Primary Examiner*—David Nelms
*Assistant Examiner*—Dao H. Nguyen
(74) *Attorney, Agent, or Firm*—Steven R. Biren

(57) ABSTRACT

A semiconductor body has source and drain regions (4 and 5; 4' and 5') spaced apart by a body region (6; 6') and a drain drift region (50; 50') and both meeting the same surface (3*a*) of the semiconductor body. An insulated gate structure (7; 70'; 700) is provided within a trench (80; 80'; 80") extending in the semiconductor body. The gate structure has a gate conductive region (70*b*; 70'*b*; 70"*b*) separated from the trench by a dielectric layer (70*a*; 70'*a*) such that a conduction channel accommodation portion (60; 60') of the body region extends along at least side walls (80*a*; 80'*a*; 80"*a*) of the trench and between the source (4; 4') and drain drift (50; 50') regions. The trench extends from the body region into the drain drift region (50; 50') and the dielectric layer has, at least on side walls (80*a*; 80'*a*; 80"*a*) of the trench, a greater thickness in the portion of the trench extending into the drain drift region (50; 50') than in the remaining portion of the trench so that an extension (71; 71'; 71"; 710) of the gate conductive region extending within the trench through the drain drift region (50; 50') towards the drain region (5; 5') forms a field plate.

12 Claims, 5 Drawing Sheets

SEMICONDUCTOR DEVICE

BACKGROUND OF THE INVENTION

1. Field of the Invention

This invention relates to a semiconductor device comprising a field effect device having a gate structure provided within a trench.

In particular, this invention relates to a semiconductor device comprising a semiconductor body comprising a field effect device wherein the semiconductor body has source and drain regions spaced apart by a body region and both meeting a surface of the semiconductor body, the field effect device having a gate structure provided within a trench for controlling a conduction channel in a conduction channel accommodation portion of the body region extending along at least the sidewalks of the trench and between the source and drain regions.

2. Description of the Prior Art

U.S. Pat. No. 4,835,584 describes such a trench transistor in which the source, gate and drain are formed within a trench in a semiconductor substrate. In this trench transistor, the gate width (where, as is understood in the art, the gate width is the dimension perpendicular to the flow of majority charge carriers through a conduction channel in the conduction channel accommodation portion and the gate length is the dimension parallel to the flow of majority charge carriers through the conduction channel) is determined by the depth of the trench and can be increased substantially without increasing the surface area occupied by the transistor, thereby enabling the device to have a good conduction channel width to length ratio and so a low on-resistance (Rdson) and good current handling capabilities or gain, without occupying an overly large area of semiconductor. However, the trench transistor proposed in U.S. Pat. No. 4,835,584 is not capable of withstanding high voltages between the source and drain regions when the device is non-conducting.

SUMMARY OF THE INVENTION

It is an aim of the present invention to provide a lateral field effect device having a trench gate structure which, in addition to having a low on-resistance, also has good reverse voltage withstanding characteristics.

In one aspect, the present invention provides a semiconductor device as set out in claim 1.

In another aspect, the present invention provides a lateral field effect semiconductor device wherein a gate structure for controlling a conduction channel between source and drain regions extends in a trench which is elongate in the direction between the source and drain regions so that a conduction channel accommodation portion is defined in a body region at least adjacent the elongate sidewalks of the trench, wherein the gate structure comprises an insulated gate structure, the trench extends beyond the body region into a drain drift region and towards the drain region with a dielectric layer on the walls of the portion of the trench in the drain drift region being is thicker than the gate dielectric layer and the gate conductive region being formed integrally with a field plate extending within the trench over the thicker dielectric layer towards the drain region. In an embodiment, a plurality of such insulated gate structures are provided. In an embodiment, the field effect device is symmetrical about the drain region.

A semiconductor device embodying the invention enables a lateral trench field effect device to be provided that has good current carrying capabilities and low on-resistance whilst also enabling relatively high voltages between the source and drain region to be withstood when the field effect device is non-conducting.

Other advantageous technical features in accordance with the present invention are set out in the appended dependent claims.

BRIEF DESCRIPTION OF THE DRAWINGS

Embodiments of the present invention will now be described, by way of example, with reference to the accompanying diagrammatic drawings in which.

It should be noted that the Figures are diagrammatic relative dimensions and proportions of parts having been shown exaggerated or reduced in size for the sake of clarity and convenience. The same reference signs are generally used to refer to corresponding or similar features in the different embodiments.

DESCRIPTION OF THE PREFERRED EMBODIMENTS

A first embodiment of a semiconductor device in accordance with the present invention is illustrated in FIGS. 1 to 5.

Figure 1:
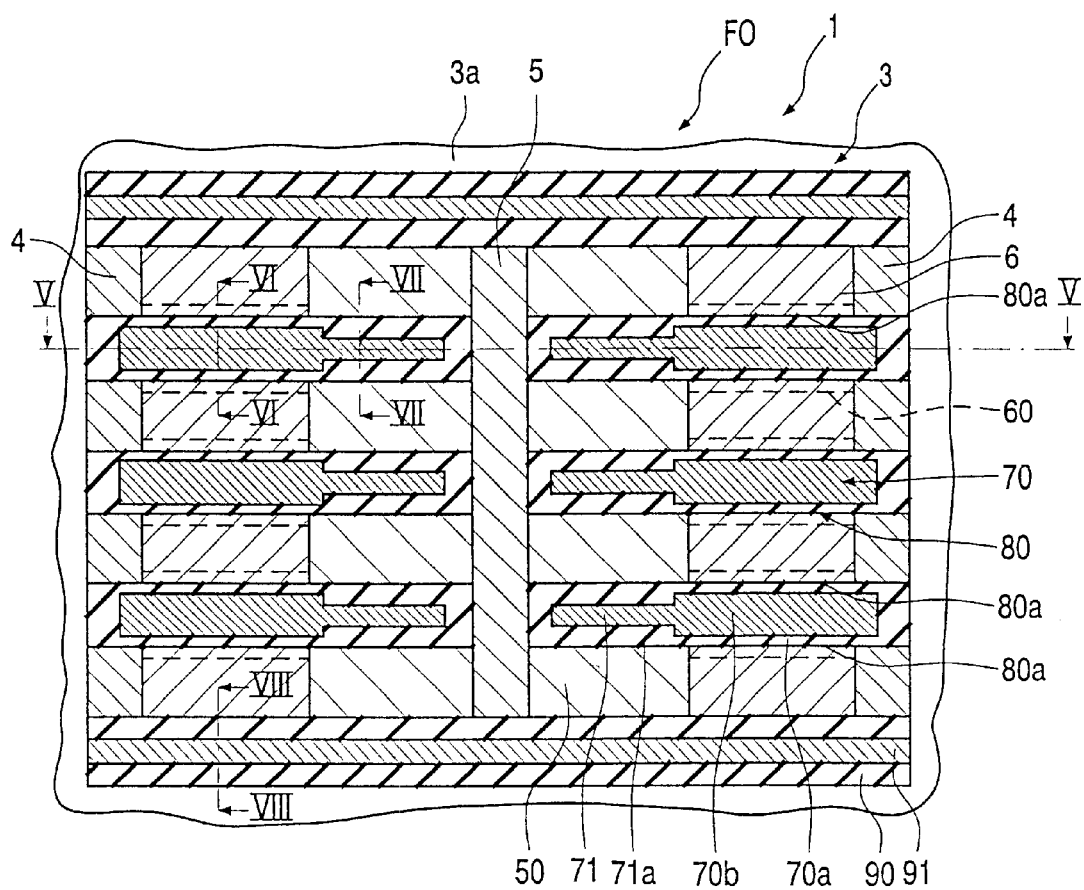
FIG. 1 shows a top plan view (with metallisation removed) of a first embodiment of a device in accordance with the present invention.

FIG. 1 shows a top plan view (with metallisation removed) while FIGS. 2, 3, 4 and 5 show cross-sectional views taken along lines V—V, VI—VI, VII—VII, VIII—VIII respectively. The metallisation is omitted in FIG. 1 to show the underlying structure.

The semiconductor device 1 shown in FIGS. 1 to 5 comprises a field effect device FD. As shown most clearly in FIGS. 2 to 5, the semiconductor device comprises a semiconductor body 1 which, in this example, comprises a silicon substrate 2 relatively highly doped with p conductivity type impurities and a silicon epitaxial layer 3 relatively lowly doped with p-conductivity type impurities, typically boron. The dopant concentration of the epitaxial layer 3 may be in the range $1\times10^{16}$ to $2\times10^{17}$ cm$^{-3}$ and the layer may have a thickness in the range 10 to 100 micrometres. The semiconductor body 11 has n conductivity type source and drain regions 4 and 5 separated by a p conductivity type body region 6 and both meeting a surface 3a of the semiconductor body. Typically, the source and drain regions 4 and 5 will have dopant concentrations in the range of from $1\times10^{19}$ cm$^{-3}$ to $1\times10^{21}$ cm$^{-3}$ and a depth of, for example, 2 to 4 micrometres. Typically, the body region 6 will have a dopant concentration of from $1\times10^{16}$ to $2\times10^{17}$ cm$^{-3}$ and a depth of the same order as but greater than that of the source region 4. The field effect device FD has a gate structure 70 provided within a trench 80 for controlling a conduction channel in a conduction channel accommodation portion 60 of the body region 6. The body region 6 is separated from the drain region 5 by a drain drift region 50 which is relatively lowly doped with n conductivity type impurities.

In the example shown in FIG. 1, the field effect device has a central drain region spaced apart by body regions 6 from source regions 4 provided on either side of the drain region 5. A plurality of gate structures 70 extending parallel to one another in respective trenches 80 are provided between each source region 4 and the drain region 5. In the arrangement shown in FIG. 1, three gate structures 70 extend between each source region 4 and the central drain region 5. It will, however, be appreciated that there may be one, two, three or many more gate structures 70 extending parallel to one another between each source region 4 and the central drain region 5.

Each gate structure 70 comprises an insulated gate structure having a gate conductive region 70b separated from the trench 80 by a gate dielectric layer 70a. Channel accommodation portions 60 of the body region 6 extend at least along side walls 80a of the trenches 80.

As shown in FIG. 1, each gate structure 70 is associated with a field plate 71 extending from the gate structure towards the drain region 5 over the drain drift region 50.

Figure 2:
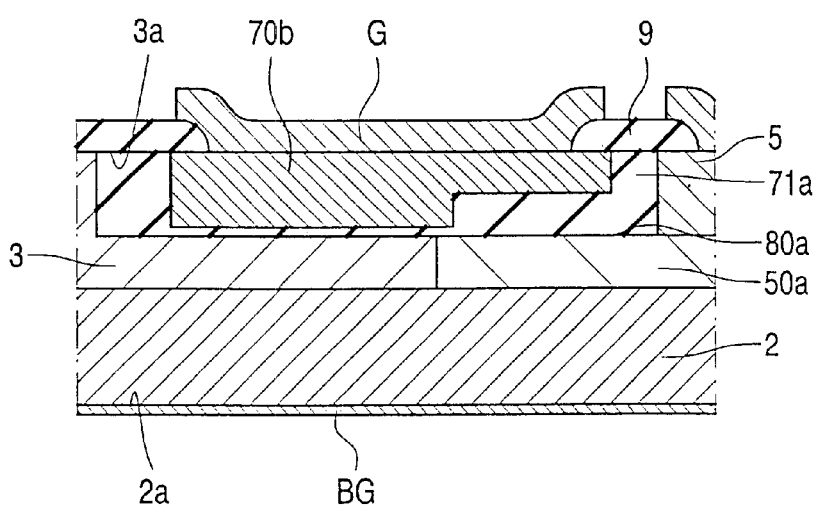
FIG. 2 shows a cross-sectional view taken along the line V—V in FIG. 1.

Each field plate 71 is formed by an extension of the gate conductive region 70b extending over a relatively thick dielectric layer 71a through the relatively lowly doped drain drift region 50. This is achieved by forming each trench 80 so that it extends through the drain drift region 50 as well as through the body portion 6 and by controlling the thickness of the dielectric layer so that a relatively thin gate dielectric layer 70a is formed on the portion of the side walls 80a of the trench 80 adjoining a conduction channel accommodation portion 60 of the body region 6 and a relatively thick dielectric layer 71a is formed on the portions of the side walls 80a of the trench 80 extending through the drain drift region 50. As shown in FIG. 2, the thickness of the dielectric on the bottom wall 80b of a trench in the drain drift region 50 may be increased in a manner similar to the thickness of the dielectric on the side walls 80a of the trench. Generally, the dopant concentration in the area 50a of the drain drift region beneath the trench will be equal to or lower than in the main part of the drain drift region between the insulated gate structures. Also, for ease of manufacture, the thickness of the dielectric layer on the bottom wall 80b of the trenches may be the same as the thickness of the gate dielectric layer 70a.

Figure 3:
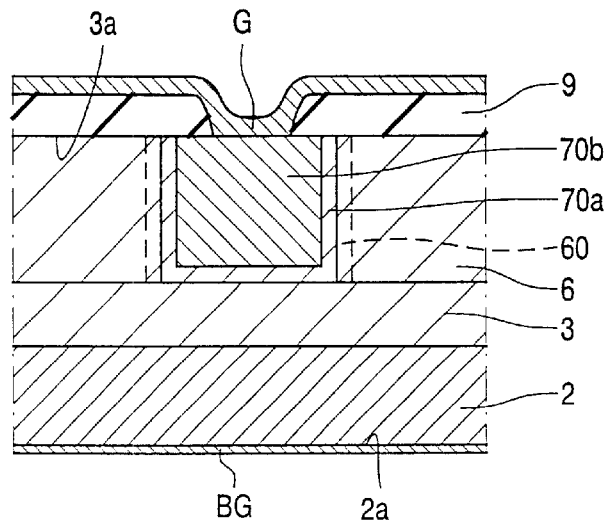
FIG. 3 shows a cross-sectional view taken along the line VI—VI in FIG. 1.
Figure 4:
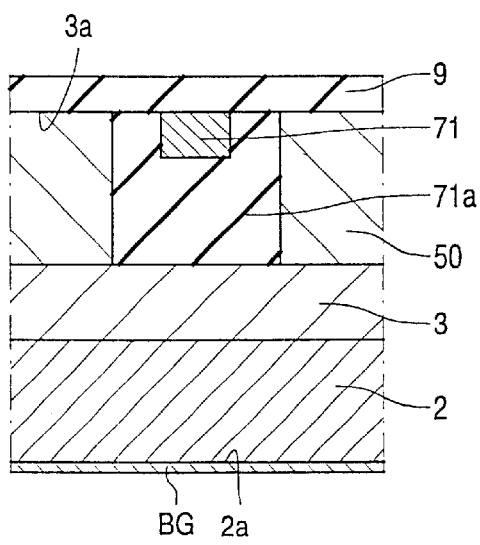
FIG. 4 shows a cross-sectional view taken along the line VII—VII in FIG. 1.

As can be seen in FIGS. 2, 3 and 4, source, drain and gate electrodes S, D and G are formed on the surface 3a in respective windows in a dielectric layer 9 so that each electrode substantially covers and makes ohmic contact with the exposed portion of the corresponding source drain or gate conductive region 4, 5 or 70b. The metallisation forming the gate electrode G extends over the dielectric layer 9 so that the three gate structures on one side of the drain region 5 are connected in series and the three gate structures on the other side of the drain region 5 in FIG. 1 are connected in series.

Figure 5:
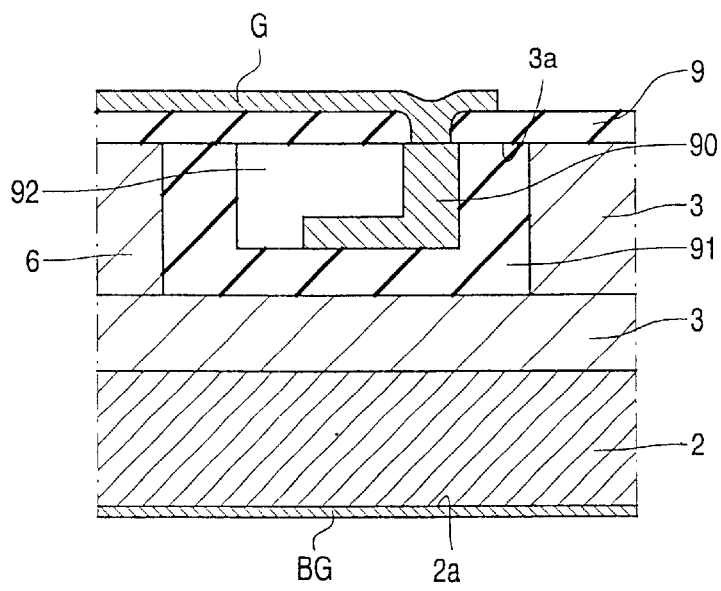
FIG. 5 shows a cross-sectional view taken along the line VIII—VIII in FIG. 1.

As shown in FIGS. 1 and 5, the field effect device FD is provided with edge termination which, in this example, consists of a further field plate 90 deposited onto a thick dielectric layer 91. The further field plate 90 is covered by a passivating layer 92 made of, for example, an insulating material such as silicon dioxide or of polycrystalline silicon. The further gate field plate 90 is ohmically coupled via a window in the overlying dielectric layer 9 to the gate electrode G.

The drain drift region 50 may have a dopant concentration of $1\times10^{19}$ to $1\times10^{21}$ cm$^{-3}$ and a thickness of 2 to 100 micrometres. The trenches 80 may have a depth of from approximately 2 micrometres to approximately 100 micrometres, dependent on the thickness of the layer in which the trenches are formed.

The device shown in FIGS. 1 to 5 may be manufactured by introduction of dopants using an appropriate mask and anisotropic etching of the trenches for the gate structures or by the use of selective epitaxial deposition into a trench formed in the epitaxial layer 3 and then, if necessary, subsequent anisotropic etching of the trenches for the gate structures. The different thicknesses of dielectric layers in the trenches may be formed by, for example, growing a thermal oxide to the thickness required for the dielectric layers 71a, then masking the areas where dielectric of that thickness is required and anisotropically etching the exposed areas of the dielectric layer to etch the dielectric away and then growing or depositing gate oxide to the thickness required for the gate dielectric layer 70a. Doped polycrystalline silicon is then be deposited to form the gate conductive regions 70b and field plates 71, the dielectric layer 9 is then deposited and patterned followed by deposition and patterning of the metallisation to form the source, gate and drain electrodes S, G and D. A back gate electrode BG may be provided on the surface 2a of the substrate 2.

In the above described examples, the field effect device is provided on a silicon substrate. This need, however, not necessarily be the case and, for example, the field effect device may be provided on an insulating layer to provide a silicon on insulator type device.

Furthermore, in the embodiment described above, the field effect device has a stripe-like geometry with the source and drain regions being elongate and rectangular when viewed in plan and the gate structures also being elongate and rectangular when viewed in plan.

The device shown in FIG. 1 may be modified by omitting either the left hand or right hand half of the device so that only a single source and a single drain region are provided. Furthermore, the structure shown in FIG. 1 may represent a unit cell that is repeated one or more times on the same semiconductor body.

Geometries other than elongate and rectangular when viewed in plan may be adopted.

Figure 6:
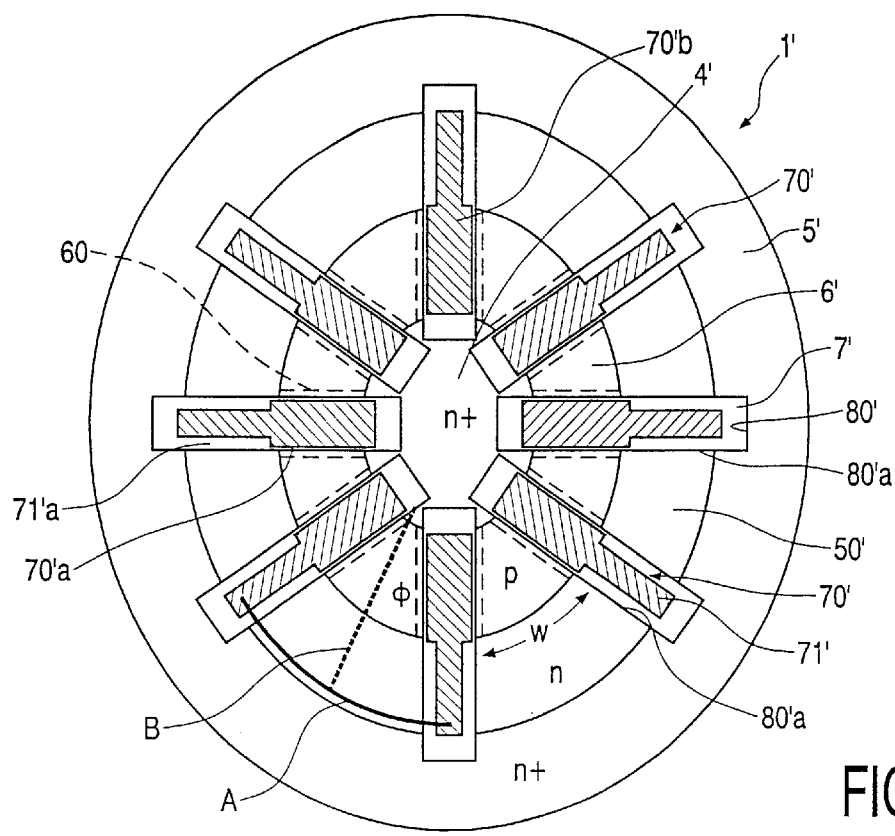
FIG. 6 shows a top plan view similar to FIG. 1 of a second embodiment of a device in accordance with the present invention.

FIG. 6 shows a plan view, similar to FIG. 1 (that is with top metallisation omitted), of a second embodiment of a device 1' in accordance with the present invention.

The device 1' shown in FIG. 6 differs from the device shown in plan view in FIG. 1 in that a circular or elliptical geometry is adopted rather than the rectangular geometry shown in FIG. 1. Thus, in FIG. 6, a central circular or elliptical source region 4' is surrounded by an annular body region 6' which is itself surrounded by an annular drain drift region 50' itself surrounded by an annular drain region 5'.

Gate structures 70' radiate outwardly from the source region 4' towards the drain region 5' so as to be equi-angularly spaced around the periphery of the source region 4'.

Each of the insulated gate structures 70' has the same general configuration as the insulated gate structures 70 described above, that is each insulated gate structure 70' is provided in a trench 80' in which the thickness of the dielectric layer is controlled so as to provide a relatively thin gate dielectric layer 70'a on the portion of side walls of the trench 80'a adjoining a conduction channel accommodation portion 50' of the body region and a relatively thick dielectric layer 71'a on portions of the side walls 80'a of the trench 8' extending through the drain drift region 50', so that an extension of the gate conductive region 70'b provides a field plate 71'.

The radial arrangement of the insulated gate structures 70' means that the width W of the drift region 50' between neighbouring field plates 70' increases in a radial direction towards the drain region 5'. When the device is in a reverse blocking mode, that is when voltages are applied to the source and drain electrodes but a voltage of zero volts (0V) is applied to the gate electrode to render the device conducting, the extent of the spread of the depletion region within the drain drift region will be controlled by the dopant concentration within the drain drift region and the angle $\phi$ subtended between adjacent trenches 80'. FIG. 6 shows a line A which follows the shape of the pn junction between the source and body regions. In this example, the line A is a circular arc. A doted line B forming a radius of a circular arc A bisects the angle $\phi$ and cuts a unit cell along an axis of symmetry. The integral dopant concentration along the line A increases in a direction away from the centre of the device, that is towards the drain region 5', so that, when the device is in a reverse blocking mode, the amount by which the depletion region extends through the drain drift region in a direction away from the source region 4' is controlled not only by the dopant concentration within the drain drift region but also by the angle $\phi$. The area of drift region that has to be depleted increases with distance from the centre of the device so effectively providing a three dimensional doping gradient increasing in the direction towards the drain region. If, for example, a device having a relatively high reverse breakdown voltage is required, then the angle $\phi$ will be made smaller while if a device having a relatively low breakdown voltage is required, then the angle $\phi$ will be increased and the radial extent of the drain drift region made smaller.

Although the arrangement shown in FIG. 6 shows a device having eight unit cells as defined by the insulated gate structures 70', the number of unit cells (that is the number of insulated gate structures) will depend upon the required device conductance characteristics and required reverse breakdown voltage as discussed above.

Figure 7:
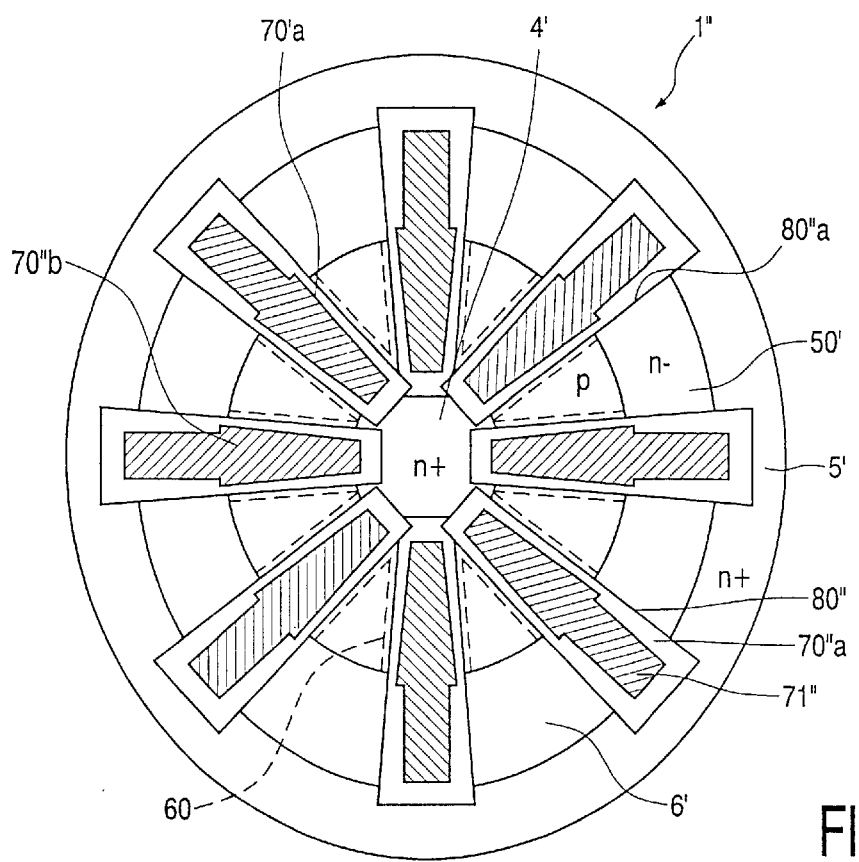
FIG. 7 shows a top plan view similar to FIG. 1 of a third embodiment of a device in accordance with the present invention.

FIG. 7 shows a plan view similar to FIG. 6 of a third embodiment of a device 1" in accordance with the present invention.

The device shown in FIG. 7 differs from that shown in FIG. 6 in that the trenches 80" are trapezoidal rather than rectangular, that is the width (that is the dimension perpendicular to a direction radiating outwardly from the source region 4') of the trenches 8" increases in a direction towards the drain region 5'. As shown in FIG. 7, the width of the gate conductive region 70"b also increases towards the drain region 5'. However, the relatively thick oxide or dielectric layer 71"a is defined so that the field plate 71" is rectangular, that is the thickness of the relatively thick dielectric layer 71"a, at least on the side walls 80"a of the trenches 80", increases towards the drain region 5' so that the influence of the field plate decreases towards the drain region 5'.

Figure 8:
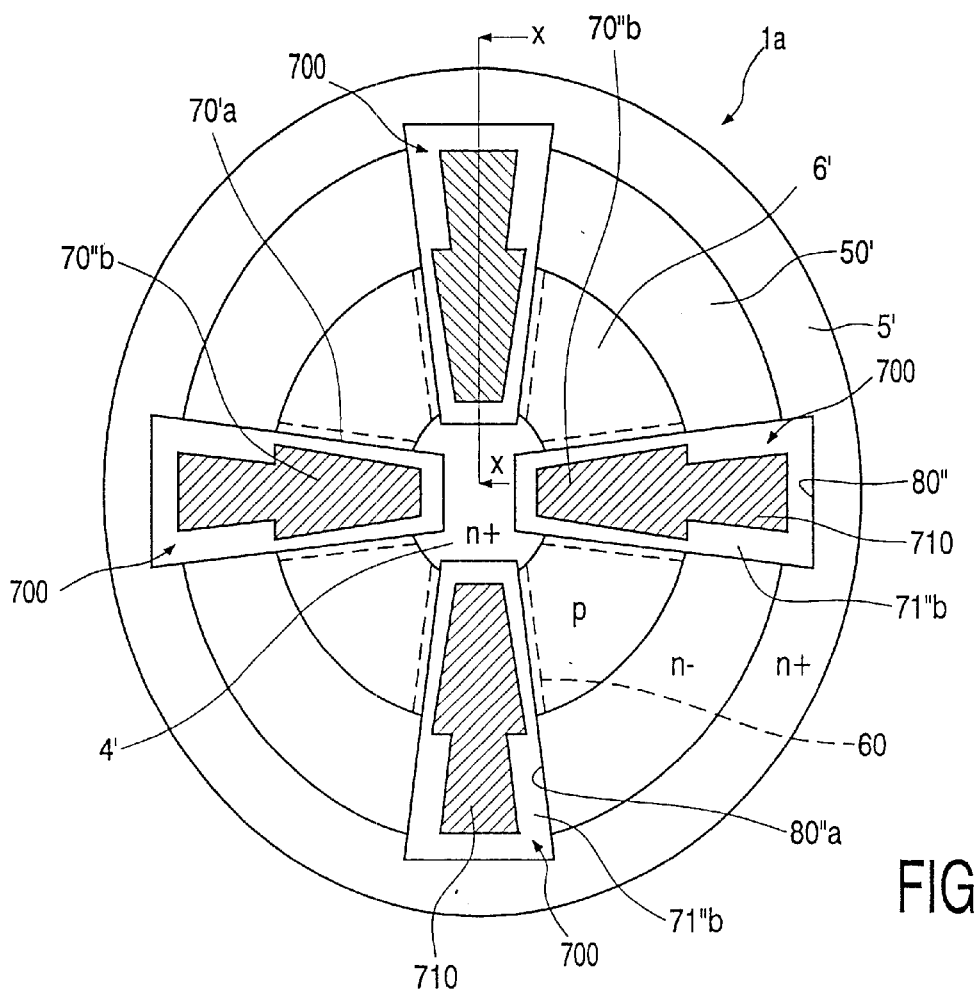
FIG. 8 shows a top plan view similar to FIG. 1 of a fourth embodiment of a device in accordance with the present invention.

FIG. 8 shows a plan view similar to FIGS. 6 and 7 of a further embodiment of a device 1a in accordance with the invention. As shown, this device 1 a consists of four unit cells defined by four insulated gate structures 700. As in the embodiment shown in FIG. 7, the trenches 80" in which the insulated gate structures are formed are trapezoidal increasing in width towards the drain region 5'. However, in this example, the field plate dielectric layer 71"b is of uniform thickness so that the field plate 710 also has a width which increases towards the drain region 5'.

Figure 9:
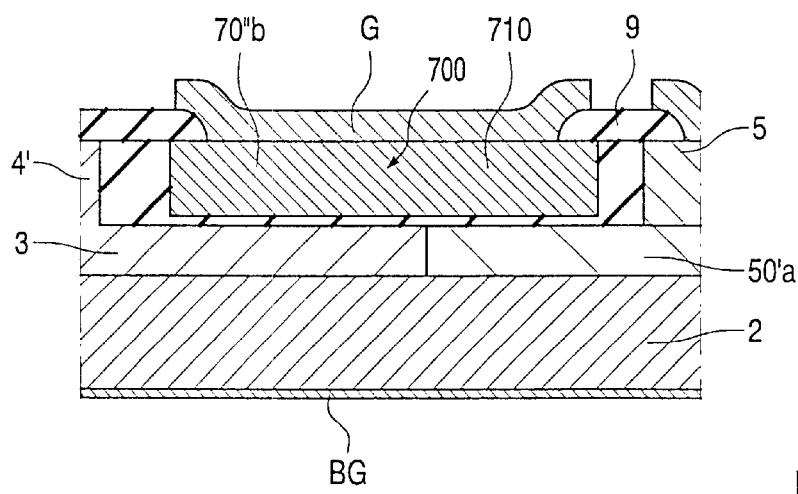
FIG. 9 shows a cross-sectional view taken along the line X—X in FIG. 8.

FIG. 9 shows a cross-sectional view taken along line X—X of FIG. 8 through an insulated gate structure 700. As can be seen, this cross-sectional view differs from that shown in FIG. 2 in that the thickness of the dielectric layer beneath the field plate 710 is the same as the thickness of the dielectric layer beneath the conductive gate region 71"b. As in the embodiment described above with reference to FIG. 2, the dopant concentration within the drift portion 50'a of the drain drift region beneath the field plate 710 is equal to or lower than the dopant concentration within the active area of the drain drift region. Of course, the structure shown in FIG. 9 could be modified so as to provide a thicker dielectric layer beneath the field plate as in the example shown in FIG. 2. The insulated gate structures shown in FIGS. 6 and 7 will have a similar cross-section to that shown in FIG. 9.

Figure 10:
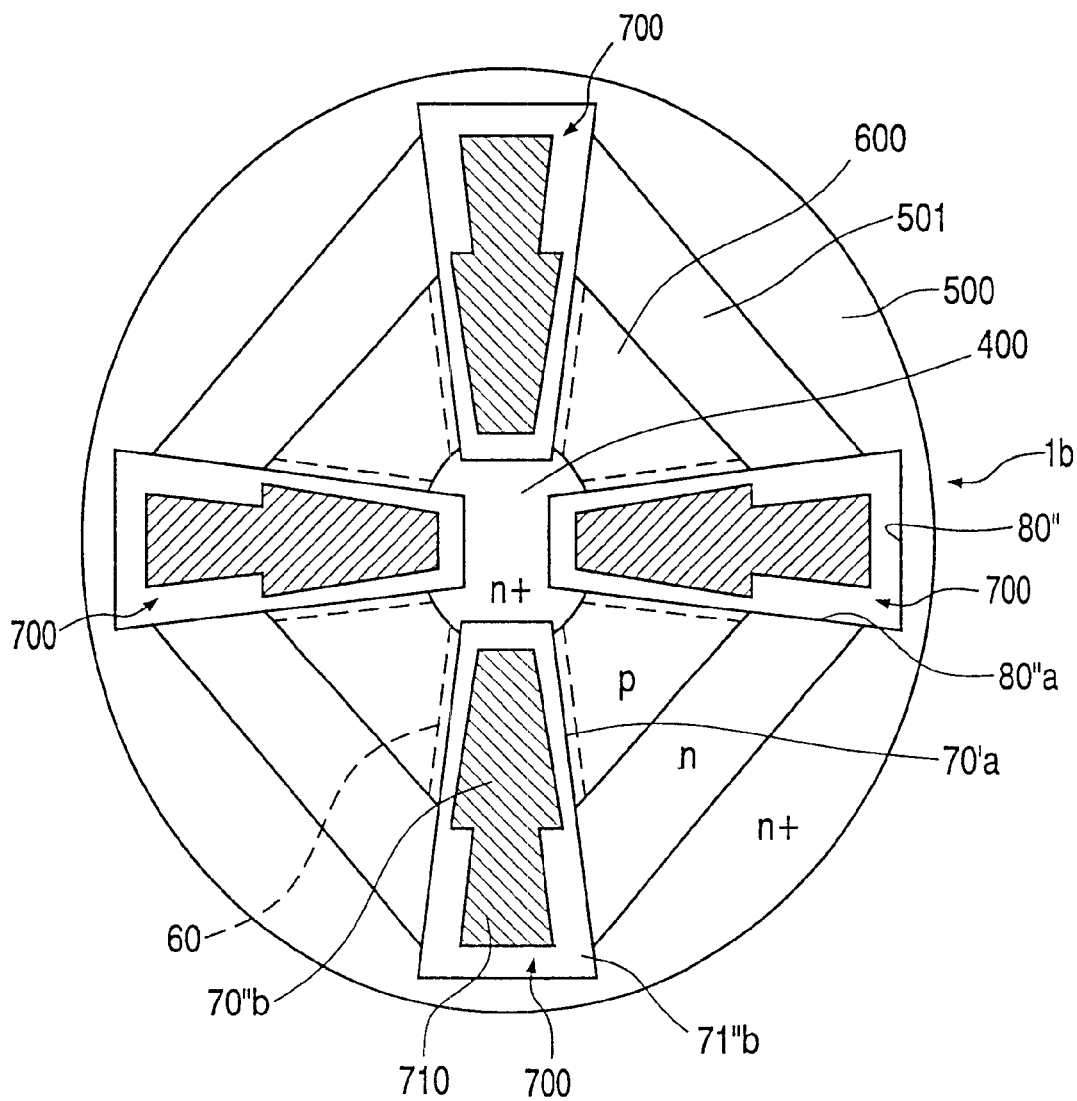
FIG. 10 shows a top plan view similar to FIG. 1 of a fifth embodiment of a device in accordance with the present invention.

FIG. 10 shows a top plan view similar to FIGS. 6 to 8 of another embodiment of a device 1b in accordance with the invention. In this embodiment, the device 1b has a square geometry with a central source region 400 surrounded by a body region 600 having a generally rectangular (or diamond shape) outer perimeter itself surrounded by a drain drift region 501 again having a generally rectangular or diamond-shaped outer periphery. The drain drift region 501 is itself surrounded by a drain region 500 having a, in this example, circular outer periphery. The insulated gate structures 700 have, in this example, the same structure as shown in FIG. 8. It will, however, be appreciated that the insulated gate configuration shown in FIG. 6 or 7 could also be adopted with this generally square geometry. Also, other geometries in which the insulated gate structures radiate outwardly from a central source region can be envisaged. Any geometry which is configured such that the separation of the insulated gate structures and thus the width of the drain drift region increases in a direction from the source region to the drain region will provide the advantages discussed above with reference to FIG. 6 with the angular separation $\phi$ of the insulated gate structures and the drain drift region dopant concentration controlling the spread of the depletion region within the drain drift region and thus the reverse breakdown characteristics of the device.

The device geometry shown in FIG. 1 may also be modified so that the trenches are trapezoidal decreasing in width towards the drain region 5 so as to provide a drain drift region 50 whose width, and therefore effective dopant concentrations, increases towards the drain region 5.

In the embodiments described above, the conduction channel accommodation portions 60 are provided along side walls of the trenches. The conduction channel accommodation portions may also be provided beneath the bottom of the trenches. Each insulated gate structure of course extends slightly into the source region so that the conduction channel accommodation portions 60 can provide a conductive path for majority charge carriers between the source and drain drift regions. As shown, the trenches meet and slightly extend into the drain region so that the field plates extend as far as the drain region.

Also, the edge termination described above may be omitted.

It will of course, be appreciated that the present invention may also be applied where the conductivity types given above are reversed and that semiconductor material other than silicon may be used such as germanium or germanium silicon alloys.

Also, the field effect transistor described above is a normally off or enhancement mode device. However, the present invention may be applied to normally on or depletion mode devices, in which case at least the part of the body region defining the channel accommodation portion will be of the same conductivity type as the source and drain regions 4 and 5. The present invention may also be applicable to MESFETs as well as to insulated gate field effect devices. In addition the field effect device may be, for example, an insulated gate bipolar transistor where the drain region is of the opposite conductivity type to the source region. The invention may also be applied to Schottky source devices.

In the above described embodiments, the gate structure extends from one end of the trench to the other. This need not be the case.

FIG. 1 illustrates a uniform thickness for the gate dielectric layer 70a where it extends from the channel area to the source region 4. However, in order to reduce the gate-source capacitance, a greater thickness for the gate dielectric layer 70a (and/or even a different dielectric material) may be used where the gate structure 70a and 70b is bounded by the source region 4. Similarly, in embodiments wherein the gate trench 80 extends into the drain region 5, a greater dielectric thickness and/or even a different dielectric material may be used.

Also as described above, the gate conductive region 70b substantially fills the trench providing the advantage of a planar surface. However, in some circumstances the conductive gate region need not substantially fill the trench but could be a relatively thin layer following the trench contour as described in U.S. Pat. No. 4,835,584.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during prosecution of the present application or of any further application derived therefrom.

What is claimed is:

1. A semiconductor device comprising a semiconductor body comprising a field effect device, the semiconductor body having source and drain regions spaced apart by a body region and a drain drift region and both said body region and said drain drift region meeting the same surface of the semiconductor body, the field effect device having an insulated gate structure for controlling a conduction channel for majority charge carriers between the source and drain regions, the insulated gate structure being provided within a trench extending in the semiconductor body and having a gate conductive region separated from the trench by a dielectric layer such that a conduction channel accommodation portion of the body region extends along at least side walls of the trench and between the source and drain drift regions, wherein the trench extends from the body region into the drain drift region and the dielectric layer has, at least on side walls of the trench, a stepped asymmetrical configuration with a greater thickness in the portion of the trench extending into the drain drift region than in the remaining portion of the trench so that an extension of the gate conductive region extending within the trench through the drain drift region towards the drain region forms a field plate.

2. A semiconductor device according to claim 1, comprising a plurality of insulated gate structures each provided within a respective trench and each having a gate conductive region separated from the trench by a dielectric layer such that a conduction channel accommodation portion of the body region extends along at least side walls of each trench, each trench extending from the body region into the drain drift region with the dielectric layer in each trench having, at least on side walls of the trench, a greater thickness in the portion of the trench extending into the drain drift region so that an extension of the gate conductive region forms a field plate extending in the drain drift region towards the drain region.

3. A semiconductor device according to claim 2, wherein the insulated gate structures extend parallel to one another and are arrayed in a direction perpendicular to the direction of majority charge carrier flow through the conduction channel accommodation portions.

4. A semiconductor device according to claim 2, wherein the field effect device has a rectangular geometry with elongate source and drain regions and wherein the insulated gate structures are elongate in a direction perpendicular to the direction in which the source and drain regions are elongate.

5. A semiconductor device according to claim 4, wherein the field effect device has a circular geometry and the insulated gate structures extend radially outwardly from the source region towards the drain region.

6. A semiconductor device according to any one of the preceding claims, wherein the or each trench is a rectangular trench.

7. A semiconductor device according to any one of claims 1 to 5, wherein the or each trench has a width which increases in a direction from the source region towards the drain region.

8. A semiconductor device according to claim 7, wherein the thickness of the dielectric layer in the portion of each trench extending in the drain drift region and at least on side walls of the trench increases in a direction towards the drain region.

9. A semiconductor device according to any one of claims 1 to 8, wherein the or each trench is elongate in a direction along said surface towards the drain region.

10. A semiconductor device according to any one of the preceding claims, wherein the or each trench has first and second ends with the first end being at least partially surrounded by the source region.

11. A semiconductor device comprising a semiconductor body comprising a field effect device, the semiconductor body having source and drain regions spaced apart by a body region and a drain drift region and both said body region and said drain drift region meeting the same surface of the semiconductor body, the field effect device having an insulated gate structure for controlling a conduction channel for majority charge carriers between the source and drain regions, the insulated gate structure being provided within a trench extending in the semiconductor body and having a gate conductive region separated from the trench by a dielectric layer such that a conduction channel accommodation portion of the body region extends along at least side walls of the trench and between the source and drain drift regions, wherein the trench extends from the body region into the drain drift region and the dielectric layer has, at least on side walls of the trench, a greater thickness in the portion of the trench extending into the drain drift region than in the remaining portion of the trench so that an extension of the gate conductive region extending within the trench through the drain drift region towards the drain region forms a field plate, further comprising a plurality of insulated gate structures each provided within a respective trench and each having a gate conductive region separated from the trench by a dielectric layer such that a conduction channel accommodation portion of the body region extends along at least side walls of each trench, each trench extending from the body region into the drain drift region with the dielectric layer in each trench having, at least on side walls of the trench, a stepped asymmetrical configuration with a greater thickness in the portion of the trench extending into the drain drift region so that an extension of the gate conductive region forms a field plate extending in the drain drift region towards the drain region, and wherein the source region is surrounded by the body, the drain drift and drain regions and the insulated gate structures are arranged around the periphery of the source region so as to extend from the source region towards the drain region whereby the separation between adjacent insulated gate structures increases with distance from the source region towards the drain region.

12. A semiconductor device comprising a semiconductor body comprising a field effect device, the semiconductor body having source and drain regions spaced apart by a body region and a drain drift region and both said body region and said drain drift region meeting the same surface of the semiconductor body, the field effect device having an insulated gate structure for controlling a conduction channel for majority charge carriers between the source and drain regions, the insulated gate structure being provided with a trench extending in the semiconductor body and having a gate conductive region separated from the trench by a dielectric layer such that a conduction channel accommodation portion of the body region extends along at least side walls of the trench and between the source and drain regions, wherein the trench extends from the body region into the drain drift region and the dielectric layer has at least one side walls of the trench, a stepped asymmetrical configuration with a greater thickness in the portion of the trench extending into the drain drift region than in the remaining portion of the trench so that an extension of the gate conductive region extending within the trench through the drain drift region towards the drain region forms a field plate, and wherein the trench is elongate having first and second ends with the first end being at least partially surrounded by the source region and the second end meeting the drain region.

* * * * *